(12) United States Patent
Köhler et al.

(10) Patent No.: US 10,018,691 B2
(45) Date of Patent: Jul. 10, 2018

(54) CORRECTION OF IMAGING METHODS IN A MAGNETIC RESONANCE DEVICE

(71) Applicants: Michael Köhler, Nürnberg (DE); Wilfried Landschütz, Baiersdorf (DE); Jürgen Nistler, Erlangen (DE); Markus Vester, Nürnberg (DE)

(72) Inventors: Michael Köhler, Nürnberg (DE); Wilfried Landschütz, Baiersdorf (DE); Jürgen Nistler, Erlangen (DE); Markus Vester, Nürnberg (DE)

(73) Assignee: Siemens Aktiengesellschaft, München (DE)

(*) Notice: Subject to any disclaimer, the term of this patent is extended or adjusted under 35 U.S.C. 154(b) by 12 days.

(21) Appl. No.: 14/938,255

(22) Filed: Nov. 11, 2015

(65) Prior Publication Data

US 2016/0146908 A1 May 26, 2016

(30) Foreign Application Priority Data

Nov. 20, 2014 (DE) .................. 10 2014 223 734

(51) Int. Cl.
*G06K 9/00* (2006.01)
*G01R 33/24* (2006.01)
*G01R 33/565* (2006.01)

(52) U.S. Cl.
CPC ....... *G01R 33/246* (2013.01); *G01R 33/5659* (2013.01)

(58) Field of Classification Search
CPC .................. G01R 33/246; G01R 33/5659
See application file for complete search history.

(56) References Cited

U.S. PATENT DOCUMENTS

| 2002/0074999 A1 | 6/2002 | Katscher et al. |
| 2006/0133693 A1* | 6/2006 | Hunt ................ G06T 3/606 |
| | | 382/293 |
| 2010/0239151 A1* | 9/2010 | Dannels ............ G01R 33/243 |
| | | 382/131 |

(Continued)

FOREIGN PATENT DOCUMENTS

EP         1211518 A1    6/2002

OTHER PUBLICATIONS

German Office Action for related German Application No. 10 2014 223 734.3 dated Oct. 11, 2016, with English Translation.

(Continued)

*Primary Examiner* — Oneal R Mistry
(74) *Attorney, Agent, or Firm* — Lempia Summerfield Katz LLP

(57) ABSTRACT

In a method, by a magnetic resonance device, a transmit $B_1$ field map is determined for a region, a plurality of MR images of at least one part of the region are acquired using transmitter settings differing from each other, and signal intensities of individual pixels measured by the MR images are interpolated by the transmit $B_1$ field map. A correction of the signal intensities may also be effected by carrying out a receive $B_1$ correction by a spatial mirroring of the transmit $B_1$ field map on a symmetry plane of a measured object. A magnetic resonance device is used to carry out the method. The method may be applied, for example, in medical diagnostics.

15 Claims, 2 Drawing Sheets

(56) References Cited

U.S. PATENT DOCUMENTS

| | | |
|---|---|---|
| 2012/0032677 A1 | 2/2012 | Dannels |
| 2012/0179023 A1* | 7/2012 | Fuderer .............. G01R 33/5612 |
| | | 600/410 |
| 2013/0251227 A1 | 9/2013 | Wang et al. |
| 2014/0035575 A1 | 2/2014 | Kabasawa et al. |
| 2016/0018501 A1* | 1/2016 | Kimura ................. A61B 5/055 |
| | | 324/322 |
| 2016/0100811 A1* | 4/2016 | Tsuji ....................... A61B 6/14 |
| | | 433/29 |
| 2016/0310761 A1* | 10/2016 | Li ........................ A61N 5/1038 |

OTHER PUBLICATIONS

Lee S.-K., et. al.: "In-vivo RF Receiver Sensitivity Measurement Using Phase-Based B1+ Mapping on a Reverse-Oriented Subject", in: Proc. Intl. Soc. Mag. Reson. Med., 2011, vol. 19, p. 4429.

Marques, Jose P., et al.: "MP2RAGE, a self bias-field corrected sequence for improved segmentation and T 1-mapping at high field." Neuroimage 49.2 (2010): 1271-1281.

Wang, Jinghua, et al.: "Measurement and correction of transmitter and receiver induced nonuniformities in vivo." Magnetic Resonance in Medicine 53.2 (2005): 408-417.

\* cited by examiner

CORRECTION OF IMAGING METHODS IN A MAGNETIC RESONANCE DEVICE

This application claims the benefit of DE 10 2014 223 734.3, filed on Nov. 20, 2014, which is hereby incorporated by reference in its entirety.

TECHNICAL FIELD

The embodiments relate to a method used to determine a transmit $B_1$ field map for a region by a magnetic resonance device. The embodiments may be applied in medical diagnostics, for example, for magnetic resonance examinations in the medical field, (e.g., for measurements on a head).

BACKGROUND

When magnetic resonance ("MR") examinations are carried out on a person, dielectric resonances cause a considerable spatial inhomogeneity in the transmit ("TX") $B_1$ field and the receive ("RX") $B_1$ field, above all in the case of field strengths in excess of two Tesla. As a result, the images generated are not homogeneous but exhibit signal differences even in the case of effectively identical tissue. This is an undesirable effect since a diagnosis may be based on the comparison of spatially separate but identical tissues, for example, between a left side and a right side of a head.

In order to compensate for the spatial inhomogeneity of the transmit (TX) $B_1$ field, the polarization of the $B_1$ field may be modulated. The possibility may therefore exist to influence the polarization by using two separate transmission channels. The use of two channels, however, does not under certain circumstances adequately reduce the problem of the location-dependent changes in contrast produced by the dielectric resonances. A greater number of channels is, however, complicated and technical implementation may be achieved only with difficulty.

An alternative is to use $B_1$-insensitive radio-frequency ("RF") pulses, but this requires more time in order to carry out a measurement. Furthermore, this method tends to introduce more energy into the patient, for which reason it may, as a general rule, only be used for special purposes.

If the tissue properties were known for each pixel of a acquired image, the MR signal behavior for each pixel may be simulated as a function of the associated $B_1$ value and a signal intensity of a pixel may be interpolated to a corrected value, namely by a Bloch simulation using the measured $B_1$ value and the sequence type used. Since the signal behavior is tissue-dependent, however, this approach is not feasible for human organs.

In order to compensate for the spatial inhomogeneity of the receive $B_1$ field, there is no solution that may be implemented physically because the receive $B_1$ field cannot be measured independently of a spin density. There are however publications that demonstrate a mirror-image relationship between the transmit $B_1$ field and the receive $B_1$ field. This is utilized, for example, by S.-K. Lee, W. T. Dixon in the publication: "In-vivo RF Receiver Sensitivity Measurement Using Phase-Based $B_1$+Mapping on a Reverse-Oriented Subject," Proc. Intl. Soc. Mag. Reson. Med., 19, p. 4429 (2011), through mirror-image positioning of the object to be measured.

In addition, image filtering may be used in order to allow the images to appear more homogeneous, for example, through high-pass filtering of the images produced. The filtering may, however, also filter out signal differences having a pathological cause, which means that as a general rule this does not represent a meaningful course of action. For example, U.S. Patent Publication No. 2014/0035575 A1 discloses an image filtering of different tissue regions that may theoretically exhibit the same signal intensity.

Approaches are also known, (e.g., from Wang et al., Magnetic Resonance in Medicine, 53, pp. 408-417 (2005)), in order to parameterize a sequence such that there are only slight contrast differences between tissues and to then utilize the sequence for a correction.

In some applications, a combination of multi-contrast measurements is used in order to separate the influence of the transmit and receive $B_1$ effects (see e.g., Marques J P, et al., "MP2RAGE: A self bias-field corrected sequence for improved segmentation and $T_1$-mapping at high field," Neuroimage 49, Vol. 2, pp. 1271-1281 (2010)). However, this is only possible with the aid of a special excitation sequence, which results in a long scan time and only one contrast type.

EP 1 211 518 A1 discloses a MR imaging method in which the acquisition of the MR data is carried out in accordance with the SENSE method using a plurality of receive coils. The differing spatial sensitivity profiles of the receive coils are utilized for the image reconstruction. If the sensitivity data used for the image reconstruction does not correspond to the spatial location of the receive coils obtaining at image acquisition time, then this results in undesirable image artifacts. The image artifacts are eliminated by automatically adjusting the spatial sensitivity profiles during the image reconstruction.

SUMMARY AND DESCRIPTION

The scope of the present invention is defined solely by the appended claims and is not affected to any degree by the statements within this summary. The present embodiments may obviate one or more of the drawbacks or limitations in the related art.

The object of the present embodiments is to at least partially overcome the disadvantages of the prior art and, in particular, to provide an improved capability for reducing image inhomogeneities caused by the effect of dielectric resonances during magnetic resonance examinations.

The object is achieved by a method wherein, by a magnetic resonance device, a transmit $B_1$ field map is determined for a predefined spatial region, a plurality of MR images of at least one part of the region is acquired using transmitter settings differing from each other, and signal intensities of pixels of the MR images are interpolated by the transmit $B_1$ field map.

In other words, spatial variations of the transmit $B_1$ field produced by dielectric resonances may be at least partially compensated for. In particular, contrast errors and/or intensity differences produced as a result of local $B_1$ transmit field strengths or flip angles deviating from a target value may thus be reduced. This takes advantage of the fact that as a result of the different transmitter settings defined variations of the local $B_1$ transmit strength or of the local flip angle are produced, which—together with the transmit $B_1$ field map as a reference—enable a particularly effective error correction.

The determination of the transmit $B_1$ field map, in particular, includes a measurement of the transmit $B_1$ field map. Alternatively, the transmit $B_1$ field map may be determined or ascertained by a numeric simulation. In general, the transmit $B_1$ field map or the receive $B_1$ field map may not be ascertained on the basis of a transmit $B_1$ field map determined by a MR experiment but by a numeric field simulation.

The MR images and the transmit $B_1$ field map are therefore resolved in a pixel-type fashion. As long as the pixels of the MR images and the transmit $B_1$ field map are not spatially identical, a spatial interpolation of the values of the transmit $B_1$ field map to the locations of the pixels of the MR images may take place.

The signal intensity of a pixel may also be referred to as its signal strength or brightness.

The transmit $B_1$ field map (also referred to as "transmit $B_1$ map" or as "TX field map") is, in particular, an image, spatially resolved in a pixel-type fashion, of the region in which the following image acquisitions are carried out. The transmit $B_1$ field map is, in particular, a three-dimensional map or a three-dimensional grid. The transmit $B_1$ field map may, in particular, be determined in the presence of an object to be measured. The acquisition of the transmit $B_1$ field map is basically well known and does not need to be described in detail here.

A transmit $B_1$ field or "TX $B_1$ field" is understood, in particular, to be an alternating magnetic field of the RF irradiation generated by a transmit coil. The generation of a transmit $B_1$ field is basically well known and does not need to be described in detail here.

A flip angle is understood, in particular, to be the angle of the RF pulse or a deflection of a magnetization from the longitudinal direction after the end of an RF pulse. The flip angle correlates, in particular, with a local strength of the $B_1$ transmit field and may be pixel related. A flip angle is basically well known and does not need to be described in detail here.

An acquisition of a MR image may be understood, in particular, to be an acquisition of a MR image carried out using the magnetic resonance device, which MR image is used for a following diagnosis or examination of an object situated in the acquisition region. The acquisition region used for the MR images may, in particular, be equal to or smaller than a region acquired through the transmit $B_1$ field map.

The voltage of the individual RF pulses in a MR sequence for producing a MR image is derived from a transmitter reference voltage, the desired flip angle of the respective RF pulse, and the shape of the RF pulse, and is proportional to the transmitter reference voltage.

A transmitter reference voltage may be understood, in particular, to be that voltage required at an amplifier in order, in the case of an RF pulse having a known (e.g., rectangular) shape and a predefined duration, to attain a flip angle averaged by way of the volume to be excited and having a predefined angular value (e.g., 90 degrees).

The transmitter setting may, in particular, be implemented through the use of a desired transmitter scaling during the acquisition of a MR image. The transmitter scaling may describe a multiplicative factor applied to the transmitter voltage, e.g., of each RF pulse. The transmitter scaling has the value 1.0 when (e.g., averaged across the volume to be excited) the nominal flip angle matches the actual flip angle.

It is an embodiment that the transmitter settings for the MR images differ by virtue of differing transmitter scalings. Such a variation may be carried out particularly simply and precisely. By this embodiment, a correction of the transmit-side spatial $B_1$ inhomogeneities may be carried out by interpolation in a pixel-type fashion of a plurality of single frames measured with differing transmitter scaling, namely with the aid of a transmit $B_1$ field map measured in advance.

An interpolation may be understood to be an interpolation as such to intermediate points between a plurality of signal intensities of the MR images, signal intensities measured by the differing transmitter settings, in particular, transmitter scalings. It may also be understood to be an extrapolation to points outside the range of the measured signal intensities.

The interpolation is carried out, in particular, up to signal intensities associated with the target flip angle at the pixel in question.

The MR images may be present as slices. An optional spatial smoothing of the MR images may then be undertaken, in particular, within the slices. A position and orientation of the slices is normally known.

The object under examination may be a living object, for example, an animal or a human being, or a part thereof such as a particular body region such as a head or an internal organ.

It is a further embodiment that at least two differing transmitter voltages lie respectively above and beneath a reference transmitter voltage, or that the transmitter scalings used are partially greater than 1, partially less than 1. In other words, an interpolation may be carried out in the narrower sense to an intermediate point, which facilitates a particularly low level of interpolation error.

It is a development that is particularly simple to implement that transmitter scalings are used for this purpose, which result in flip angles that are partially less than and partially greater than the target flip angle.

In particular, at least two transmitter voltages may be chosen such that the flip angle resulting from the voltage in all the spatial parts of interest of the image is less than the target flip angle in the case of the one voltage and greater than the target flip angle in the case of the other voltage.

It is a further embodiment that the signal intensities of individual pixels are interpolated linearly. This yields the advantage that only two MR images are required and moreover that the computing power required is minimal.

It is a further embodiment that the signal intensities of individual pixels are interpolated quadratically. This yields the advantage of an increased interpolation accuracy in the case of three or more MR images. In particular, if in the case of major inhomogeneities in the $B_1$ transmit field (for example +/−20%) the quality of the linear interpolation is frequently inadequate, quadratic interpolation may advantageously be employed. As a further advantage, quadratic interpolation may register a reversal of the signal behavior, where the signal intensities of the MR images exhibit no monotonic dependence on the transmitter scaling.

The interpolation accuracy at least of the linear and the quadratic interpolation may be increased yet further if it is carried out on the basis of a logarithmic scale. The interpolation accuracy may, in particular, be further improved if both the transmitter scalings and also the signal intensity are evaluated on a logarithmic scale, for example, in decibels $dB(x)=20 \cdot \log(x)$.

In general, it is also possible to carry out interpolations of a yet higher level, for example, a cubic interpolation.

The intensities of individual pixels may therefore be interpolated by a weighted sum or the interpolation may simply be regarded as a weighted sum of the individual MR images, where associated weighting factors are calculated from the transmit $B_1$ field map at the location of the pixel and the differing transmitter scalings. A location-dependent noise increase factor may be calculated previously from the associated weighting factors of the transmit $B_1$ field map. In particular, a constant noise increase factor may thus be assigned to each pixel of the transmit $B_1$ field map, which facilitates a calculation of the interpolated signal intensity. This may be carried out, for example, in formal analogy to the so-called SENSE image reconstruction (see, e.g., EP 1

211 518 A1). In the present case, the single frames do not however originate from different receive coils but from a plurality of measurements or image acquisitions using the same receive coil or a coil combination (e.g., a receive coil fixed in the apparatus or "body coil"), but, for example, using different transmitter scalings. The weighting factor map {z1, z2, . . . } derived from the (e.g., scaled) transmit $B_1$ field map now replaces the SENSE weighting factor maps derived hitherto from the receive coil profiles. By analogy with the g-factor in the case of SENSE, with a known transmit $B_1$ field map and given transmitter scalings a location-dependent noise increase factor g, which here may also be less than one, may likewise be specified.

The calculation of the noise increase factors of the pixels of the transmit $B_1$ field map may be used for the linear, quadratic, or even higher-level interpolation.

It is furthermore an embodiment that a movement correction is carried out on at least one MR image in order to further improve an interpolation accuracy. In particular, a correction of the signal intensities of the pixels of a MR image is carried out as a function of a movement of the measured object. The image acquisitions may normally not be time-interleaved because a state of equilibrium of the magnetization is only established slowly. The danger therefore exists that as a result of an object movement (e.g., breathing or an involuntary head movement) the successively measured MR images are not consistent with one another at some points (e.g., at the edges thereof). The movement may be corrected by the stated movement correction during the measurement and/or by image processing or so-called data "post-processing". A movement correction of MR data is basically well known and does not need to be described in detail here.

It is a development that the extended measurement duration of the method resulting from the multiple image acquisitions is at least partially compensated for by faster imaging. This may be achieved, for example, by steeper gradients with a higher readout bandwidth.

It is also an embodiment that a parallel imaging is carried out in order to at least partially compensate for the extended measurement duration of the method resulting from the multiple image acquisition.

A factor common to both methods for compensating for the extended measurement duration resulting from the multiple image acquisition is the fact that their MR images exhibit a poorer signal-to-noise ratio, SNR, than a single acquisition with a longer measurement duration on account of the shortened measurement duration of the individual image acquisitions. The SNR may thus be poorer at half the measuring time, for example, by a factor of approximately root $(0.5) \approx 0.707$. The signal-to-noise ratio is however improved again in part by the interpolation according to the method because an averaging gain is achieved as a result of the multiple image acquisitions. The gain in signal-to-noise ratio is root $(2) \approx 1.414$ if the nominal flip angle lies precisely centrally between two measured actual flip angles assigned to the MR images acquired using differing transmitter scalings. To this end, it is advantageous if the transmitter scalings used do not differ too greatly from one another.

An extrapolation to nominal flip angles outside the measured transmitter scalings used might also result in an undesired increase in noise. In order also to avoid the effects, it is advantageous to the separate the transmitter scalings to such an extent that the actual flip angle in the volume of interest lies in a range of values given by the nominal flip angle multiplied by the transmitter scaling. In other words, an interpolation is performed as such and not as an extrapolation.

A possible computation process may, for example, assume the form described in the following when logarithmic scaling is employed.

In the following, a normalization to a target $B_1$ value is performed as an alternative to the normalization to the transmitter voltage. The normalized transmit $B_1$ field map thereby ultimately specifies in each location the factor by which the flip angle actually attained there deviates from a target flip angle or the factor by which the $B_1$ field actually present there deviates from the intended value.

The following are taken as given as input data for the computation process: a transmit $B_1$ target value "$B_1$ Target" of the $B_1$ field strength for a desired contrast; a transmit $B_1$ field map "B1_U(r)" measured in advance, which is normalized, for example, to a unit value U(r) of the transmitter voltage; a list of the selected transmitter voltages U1, U2, . . . ; and a plurality of MR images having measured signal intensities or signal strengths S1(r), S2(r), . . . of the individual pixels. An estimate of the signal intensity S(r) that would result in the case of the transmit $B_1$ target value B1 Target is produced as the desired result of the computation process.

In the course of the computation process, in location-dependent fashion or depending on a particular pixel r, the transmit $B_1$ field strengths achieved with the predefined transmitter voltages U1, U2, . . . are in each case determined actually at the pixel r in accordance with:

$$B11(r)=B1\_U(r)*U1,$$

$$B12(r)=B1\_U(r)*U2, \ldots.$$

and used in logarithmized form, for example, in accordance with:

$$x1(r)=dB(B11(r)),$$

$$x2(r)=dB(B12(r)), \ldots.$$

as abscissa values for the interpolation.

A logarithmized target value xT of B1 Target corresponds here to:

$$xT=dB(B1\text{Target}).$$

In addition, weighting factors z and therefrom a noise increase factor g are calculated for each pixel, for example, for a linear interpolation in accordance with:

$$n=(x2-x1)$$

$$z1=(x2-x)/n$$

$$z2=(x-x1)/n$$

$$g=\text{root}(z1^2+z2^2)$$

or for a quadratic interpolation in accordance with $$n=x3^2*(x2-x1)-x2^2*(x3-x1)+x1^2*(x3-x2)$$

$$z1=((x3-x2)*x^2-(x3^2-x2^2)*x-x3*x2^2+x3^2*x2)/n$$

$$z2=((x1-x3)*x^2-(x1^2-x3^2)*x-x3^2*x1+x3*x1^2)/n$$

$$z3=((x2-x1)*x^2-(x2^2-x1^2)*x-x2*x1^2+x2^2*x1)/n$$

$$g=\text{root}(z1^2+z2^2+z3^3).$$

The weighted sum for the various MR images may then be calculated by a logarithmization in accordance with:

$y1(r)=dB(S1(r))$, $y2(r)=dB(S2(r))$, $y3(r)=dB(S3(r))$, ....

and a following combination:

$y=z1*y1+z2*y2$ (for two MR images)

or:

$y=z1*y1+z2*y2+z3*y3$ (for three MR images)

etc. There follows a delogarithmization for each pixel r in accordance with $S(r)=10^{\wedge}(y(r)/20)$.

It is a further embodiment that a plurality of interpolations having different target $B_1$ values is carried out from a plurality of MR images having differing transmitter scalings. The interpolation images produced as a result of the different target $B_1$ values as a general rule exhibit different contrasts, for example, T1 contrast, (e.g., of tissue(s)). A user may, for example, use this in order to interactively select the interpolated image having the best contrast by using a (e.g., virtual) "contrast slider control". This is expedient, in particular, in the situation when measurements have been carried out using three (or even more) different transmitter settings. In particular, a plurality of interpolated MR images having different transmit $B_1$ target values and consequently having different contrasts may subsequently be calculated from an image data set including a plurality of measured MR images.

In the event of an imaging technology that (e.g., by an inversion pulse) also involves a phase position of the spins, it is an embodiment that the interpolation is based not on the "magnitude images" composed from the absolutes values of signal amplitudes but on ("phased") images provided with information relating to the phase position. This yields the advantage that information relating to a zero transition of the signal intensity is not lost and thus an even more precise interpolation is made possible. For this purpose it may be advantageous that—if possible—a sign-sensitive and/or phase-sensitive interpolation is carried out.

It is also an embodiment that in addition to or as an alternative to the method described above, a receive $B_1$ correction is carried out in order to correct receive-side inhomogeneities. Differing signal intensities in different parts of the MR images, which are caused by a variation of the receive $B_1$ field, may thus be compensated for. In particular, image errors caused by inhomogeneous RF fields in an object to be measured, for example, in a patient, may be significantly reduced.

It is a development thereof that the receive $B_1$ correction is carried out by ascertaining a sensitivity profile in the receive case by spatial mirroring of the transmit $B_1$ field map on a symmetry plane of the measured object, in particular, of a patient. The sensitivity profile may also be referred to as a sensitivity field map. It may have the same pixels as the transmit $B_1$ field map. In other words, a pixel of the sensitivity field map may be assigned to each pixel of the transmit $B_1$ field map. This facilitates a pixel-type relationship between the two field maps.

The fact that a receive $B_1$ correction is carried out by a spatial mirroring of the transmit $B_1$ field map on a symmetry plane of a measured object also achieves the object independently.

In particular, the receive $B_1$ field may be estimated by the transmit $B_1$ field map. This may be carried out particularly effectively for objects to be measured or partial regions thereof which exhibit a sufficiently symmetrical conductivity distribution (such as, for example, a head) and if the MR measuring device has at least one symmetrical transmit/receive coil, in which case the symmetry planes of the object to be measured and of the at least one transmit/receive coil may be the same if possible for a slight calculation error. These conditions are given, for example, for measurements using conventional (e.g., volume excitation) body coils if the object to be measured is centered in the body coil. Simulations have shown that the receive $B_1$ field in these cases is, e.g., proportional to the mirrored transmit $B_1$ field.

This proportionality effect may be explained by the physical symmetry of the transmit $B_1$ field: inverting a sign of the x-axis (in other words, carrying out a spatial mirroring between left and right sides with reference to a spatial x=0 plane) also inverts the direction of rotation of a circularly polarized $B_1$ component in the x-y plane. That is, $B_1+$ and $B_1-$ are swapped. In this situation, $B_1+$ corresponds to the transmit $B_1$ field and $B_1-$ corresponds to the receive $B_1$ field or the receive sensitivity of a coil. In principle, other mirror symmetry planes around the $B_0$ axis may also be selected (e.g., in order to mirror between top and bottom or each oblique mirror plane around the $B_0$ axis). However, on account of the left-right symmetry of a human body, utilization of mirror symmetry about x=0 is best suited as a general rule. However, the field sources (in other words, the transmitters and receivers or antennas) may also at least exhibit approximately the same mirror symmetry.

The x=0 plane here, e.g., corresponds to a sagittal slice orientation and the y=0 plane corresponds to a coronary slice orientation.

This symmetry requirement may, for example, be met by a quadrature RX/TX birdcage antenna. If, for example, a RX/TX birdcage is being operated in order to produce an elliptically polarized transmit $B_1$ field with a half-axis lying obliquely in the space, the mirrored ellipse may be derived for reception by a corresponding weighted addition of two receive channels.

The method is however not restricted to image acquisitions or measurements in which the body coil(s) is/are used as receive coil(s). By analogy with a conventional arrangement, so-called "local receive coils" may also be placed around the object to be examined or measured. Since the receive profile of the local receive coils is as a general rule inhomogeneous in relation to the entire object to be examined, the receive sensitivity may be normalized to the receive sensitivity of the volume excitation body coil fixed in the device, which as a general rule is far more homogeneous than the receive profile of the (e.g., potentially very small) local receive coils. The normalization is known from standard clinical imaging. As already described above, physical effects may also result in inhomogeneities in the receive profile of volume excitation body coils fixed in the device. In the above application, the inhomogeneities in the body coil receive profile are then transferred to the MR images measured by the local receive coils. In the approach proposed here, the receive profile (corresponding to a spatial distribution of a receive sensitivity) of the body coil(s) is estimated and then the estimated receive profile is used in order to correct the signal intensity of the pixels.

The method described above may therefore also relate to MR images or MR measurements in which the body coil(s) is/are used as receive element(s). It may also relate to applications in which local coils are used and the resulting MR images are normalized to the receive profile of the body coil(s).

Conventionally, a body coil has two independent subsystems. It is assumed here that the associated elements (in other words individual coils) of the body coil are grouped to form a vertical subsystem and a horizontal subsystem, where each subsystem may generate a linearly polarized transmit $B_1$ field. In the receive case, the signals of the two subsystems are combined, for example, by a sum-of-squares combination. The receive field of the subsystems is therefore advantageously determined separately. This may be achieved in accordance with the present method by the determination of the transmit $B_1$ field generated separately by each of the subsystems, for example, by generating a respective transmit $B_1$ field map as is basically known. The respective transmit $B_1$ field of each subsystem may be determined through separate application of a respective transmitter voltage of the associated subsystem during a coding act of the transmit $B_1$ field map measurement. Alternatively, the transmit $B_1$ field of two differing coil combinations may be measured and thereafter the calculation of the underlying transmit $B_1$ fields of the subsystems carried out. The latter approach may be employed, in particular, if the two coil combinations differ sufficiently from one another and the system properties such as reflections and couplings between the two subsystems are known. The approach of separately grouped subsystems includes, in particular, controlling the two subsystems of the body coil separately as transmit elements or being able to use at least two different coil combinations for sending out a transmit $B_1$ field.

In order to determine the actual receive profiles of the (e.g., two) subsystems of the body coil, the transmit $B_1$ fields are mirrored on the symmetry plane. It is furthermore advantageous to correct all the deviations in the data acquisition path between the two subsystems. The deviations are, in particular, measured separately. Since the deviations of the receive path do not contribute to the measurements described above of the transmit $B_1$ field, they are considered separately in order to achieve a correspondence between the mirrored transmit $B_1$ fields and the actual receive sensitivity of the individual subsystems. The scaled receive $B_1$ field maps are combined in the same manner as the data of the body coil receive channel in the receive case (e.g., by a sum-of-squares combination). The combination yields the receive $B_1$ profile contained in the MR images that are to be corrected.

The MR images may be divided by the receive $B_1$ profile. Variations or fluctuations of the receive $B_1$ profile may thus be removed from the MR images.

The object is also achieved by a magnetic resonance device designed in order to carry out the method.

The magnetic resonance device may advantageously be employed in the field of human or animal diagnostics.

BRIEF DESCRIPTION OF THE DRAWINGS

For the sake of clarity, the same elements or elements having the same function are identified by the same reference characters.

DETAILED DESCRIPTION

Figure 1:
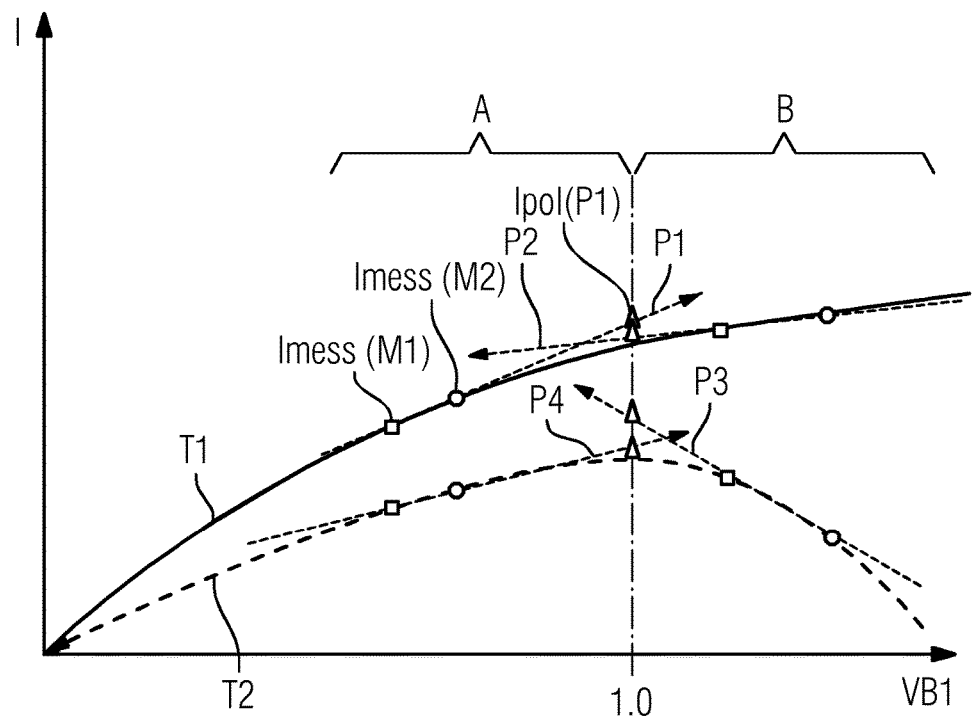
FIG. 1 depicts an example of a signal intensity of pixels of a plurality of MR images plotted against a ratio of an actual transmit $B_1$ value at the location of a respective pixel to a transmit $B_1$ target value for different local regions and tissue types.

FIG. 1 depicts a signal intensity or signal strength I in arbitrary units of pixels of two MR measurements or MR images M1 and M2 plotted against a ratio VB1 of an actual transmit $B_1$ value at the location of a respective pixel to a transmit $B_1$ target value. The ratio also corresponds to a ratio of a correspondingly arising actual flip angle to a target flip angle. The MR images M1 and M2 differ from one another by virtue of differing transmitter settings, in particular, for differing transmitter scalings. The signal intensities measured in this situation are dependent on the local transmit $B_1$ values for M1 and for M2.

To the left of the ratio VB1=1, in other words where VB<1, the measured transmit $B_1$ value is too low in a spatial region A of the object to be measured. Conversely, to the right of the ratio VB1=1, in other words where VB>1, the actual transmit $B_1$ value is too high in another spatial region A of the object to be measured.

The ratio VB1 is given by the transmitter scaling multiplied by the relative local deviation from the nominal flip angle ascertained through the transmit $B_1$ map.

The measured signal intensities Imess are plotted for two differing tissue types T1 and T2, where the measured signal intensities of a common tissue T1 or T2 are connected to one another by imaginary lines. The measurement results or MR images M1 and M2 are represented by a square and a circle respectively.

Since the actual transmit $B_1$ values or the transmit $B_1$ field are known from the transmit $B_1$ field map, a linear interpolation, for example, of the measured signal intensities Imess to the signal intensities in the case of transmit $B_1$ target values may now be carried out (in other words to interpolated signal intensities Ipol that would have been measured if the desired transmit $B_1$ field strength were present). This applies analogously to region B.

The associated four interpolation lines P1 to P4 are indicated by corresponding dashed linear arrows. The intersection of the interpolation lines P1 to P4 with a perpendicular through the value VB1=1 yields the associated interpolated signal intensities Ipol. Accordingly (TX-)corrected MR images may be composed from the interpolated signal intensities Ipol for all the pixels.

While the interpolations shown are implemented as extrapolations, in other words have an interpolated signal intensity Ipol in each case on the VB1 axis alongside or outside the measured signal intensities Imess, for a particularly precise interpolation it is in the narrower sense advantageous that a measurement value Imess (M1) of the first MR image M1 is arranged to the left or right alongside VB1=1 and the measurement value Imess (M2) of the second MR image M2 belonging to the same pixel is then arranged on the other side alongside VB1=1, in other words to the right or left alongside VB1=1. This may also be expressed in such a manner that the two differing transmitter scalings associated with the MR images M1 and M2 are chosen such that the flip angle achieved in each case is on the one hand smaller and on the other hand greater than the target flip angle at the location in question.

Figure 2:
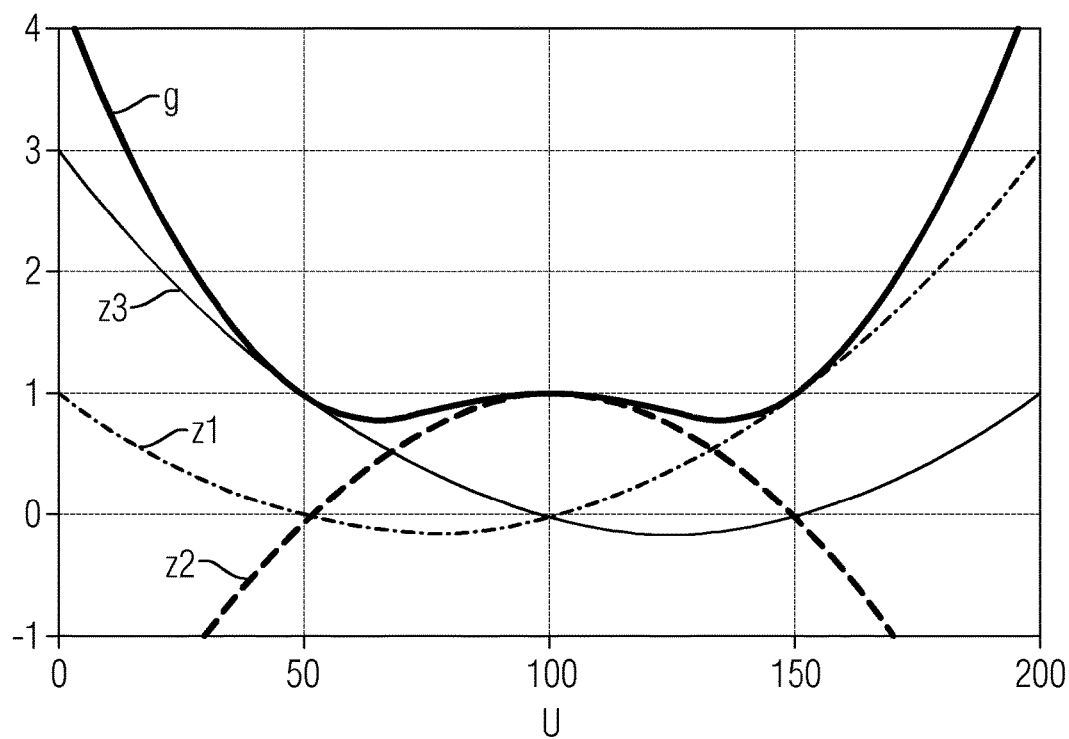
FIG. 2 depicts an example of a noise increase factor g plotted against a transmitter voltage with quadratic interpolation from three measurements with differing transmitter voltages.

FIG. 2 depicts a noise increase factor g, plotted on a dimensionless numeric scale against a transmitter voltage U, of an arbitrary but then fixedly chosen pixel in the case of quadratic interpolation from three measurements or MR images M1, M2 and M3 with differing transmitter voltages U1=50V, U2=100V or U3=150V. The voltage plotted on the abscissa is the transmit voltage, which in the pixel in question would result in the target $B_1$ value being achieved or in the target flip angle being achieved. Also illustrated are the curves of the weighting factors z1, z2 and z3 for the three individual MR images M1, M2 or M3.

If one of the actually applied transmitter voltages U1 to U3 coincides with the voltage plotted on the abscissa, the g-factor is exactly one because only this one measurement contributes to the result. A noise reduction (g<1) through averaging results between these sampling points; a noise increase (g>1) results outside the sampling points.

Figure 3:
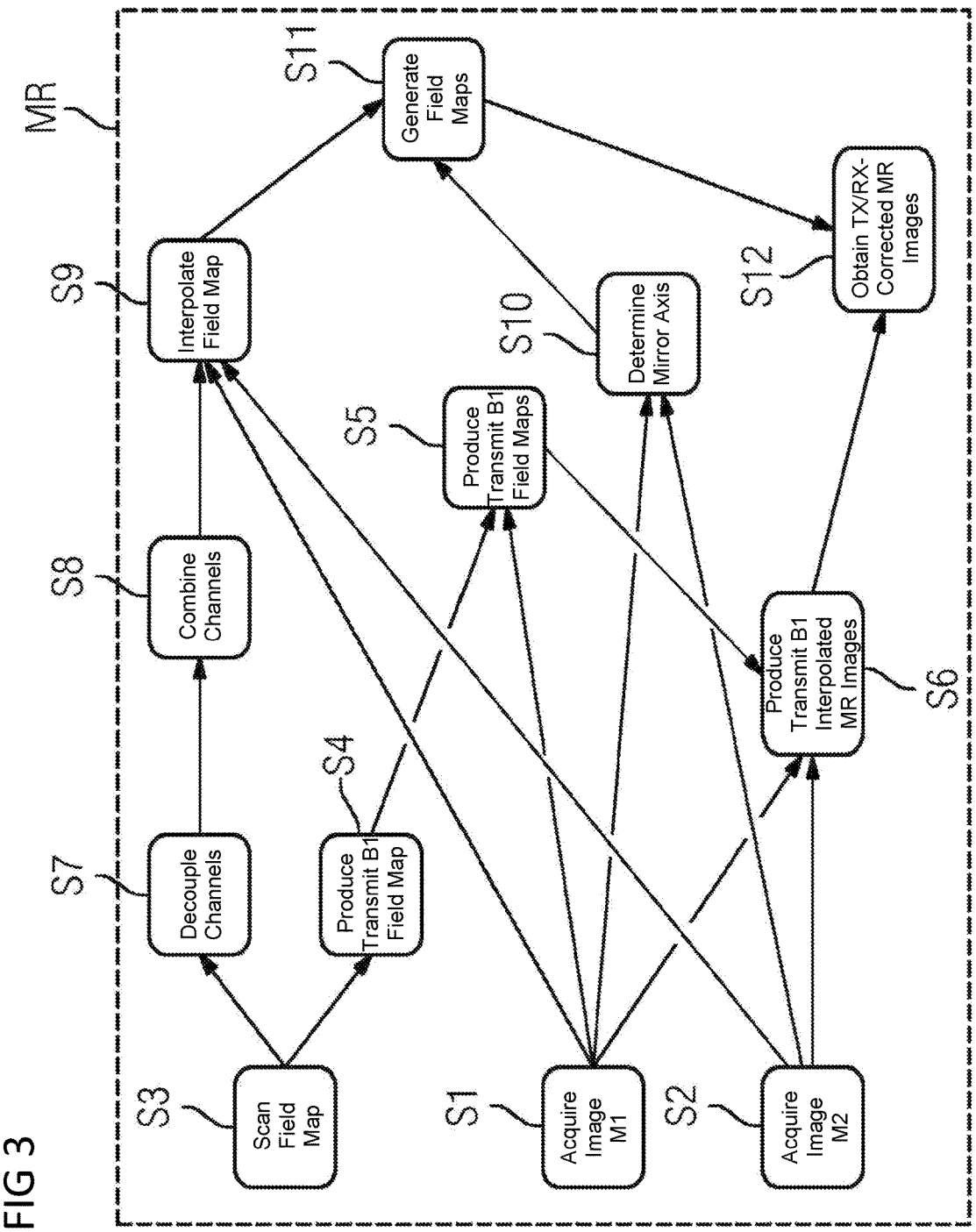
FIG. 3 depicts a possible exemplary embodiment of the method on the basis of a flowchart.

FIG. 3 depicts by way of illustration a possible flowchart of the method having a plurality of processing acts for two measured MR images M1 and M2. The method may, for example, be executed in a magnetic resonance device MR. This may, for example, have a MR unit and, integrated therein or separate therefrom, and an evaluation unit. The processing acts shown may at least in part also be carried out in the context of "post-processing" carried out subsequent to a measurement.

In acts S1 and S2, MR images M1 or M2 may be acquired in order to correct MR images M1 and M2 in respect of the transmit $B_1$ field ("TX correction") and the receive $B_1$ field ("RX correction"). The MR images M1 and M2 differ in their transmitter settings, for example, in their transmitter voltages. The (e.g., predefined) positions of the scan slices and the orientation thereof may also be read out from the MR images M1 and M2 or are known for the MR images M1 and M2.

Parallel thereto (e.g., beforehand or afterwards), in act S3, a here channel-selective scan of the three-dimensional transmit $B_1$ field map is carried out. The channels may, for example, belong to predetermined, selectively controllable subsystems of an antenna unit of the magnetic resonance device MR.

In act S4 following S3, a phase-dependent or phase-sensitive combination of the channels may be carried out, whereby a transmit $B_1$ field map is produced for the polarization (e.g., circular polarization) present in the transmit case.

In a further act S5, the transmit $B_1$ field map is spatially interpolated (and, if necessary, smoothed), which yields respective transmit $B_1$ field maps for the pixels of the MR images M1 and M2, in particular, for each slice of the MR images M1 and M2.

In an (interpolation) act S6, the transmit $B_1$ field maps for the MR images M1 and M2 are used in order to provide transmit $B_1$ target values for the interpolation in a pixel-type fashion of the measured signal intensities of the MR images M1 and M2, for example, as already described under FIG. 1 and/or FIG. 2. Carrying out the interpolation in act S6 then yields the transmit $B_1$ interpolated (TX-corrected) MR images.

In act S7, the three-dimensional transmit $B_1$ field map from act S3 may also be used in order to decouple the channels of the subsystems, while subsequently in act S8 the channels—as already described above, for example—are advantageously combined by a sum-of-squares combination.

In act S9, the combined transmit $B_1$ field map may be spatially interpolated (and, if necessary, also smoothed), namely by using the positions and orientations of the scan slices of the MR images M1 and M2 known from acts S1 and S2.

In act S10, a mirror axis of the object to be examined or a part thereof may be determined with the aid of the MR images M1 and M2 and also with the aid of the known positions and orientations of the scan slices of the MR images M1 and M2.

From this, in act S11, transmit $B_1$ field maps mirrored on the mirror axis may be generated from the spatially interpolated, sum-of-squares combined transmit $B_1$ field map from act S9, in particular, for each slice of the MR images M1 and M2.

In act S12, The TX-corrected MR images M1 and M2 determined in act S6 may be divided by the mirrored transmit $B_1$ field maps in order to thus obtain TX- and RX-corrected (or transmit and receive branch corrected) MR images M1 and M2.

For magnetic resonance devices that do not offer the possibility to determine channel-selective $B_1$ maps, the phase-sensitive combination and the sum-of-squares combination of the $B_1$ field maps may be replaced by a combined excitation, where applicable with a certain loss of correction power.

Alternatively, for ascertaining the $B_1$ transmit map by a MR measurement, it is also possible to utilize a numeric simulation of the fields in order to calculate a $B_1$ transmit map, in particular, with the aid of the geometry and properties of the transmit coils, the current position of the examined object and the assumed electromagnetic properties thereof. The $B_1$ receive map may also be created by a simulation and then replaces the mirrored $B_1$ transmit map from act S11.

Generally, "a(n)", "one", etc. may be understood to refer to a singular or a plural, in particular, in the sense of "at least one" or "one or a plurality", etc., as long as this is not explicitly excluded, for example, by the expression "exactly one," etc.

Moreover, a number specification may also include both the specified number exactly and a usual tolerance range, provided that this has not been explicitly excluded.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method, using a magnetic resonance (MR) device, comprising:
   determining a transmit $B_1$ field map for a region;
   acquiring, by the MR device, a plurality of MR images of at least one part of the region, each MR image of the plurality of MR images being acquired using transmitter settings differing from transmitter settings used to acquire another MR image of the plurality of MR images;

interpolating signal intensities of pixels of the plurality of MR images using the transmit $B_1$ field map;

generating a resultant MR image based on the interpolation of the signal intensities of the pixels, wherein a receive-side $B_1$ correction is carried out by a spatial mirroring of the transmit $B_1$ field map on a symmetry plane of a measured object.

2. The method as claimed in claim 1, wherein the transmitter settings differ by virtue of differing transmitter scalings.

3. The method as claimed in claim 2, wherein at least two differing transmitter voltages lie above and beneath a reference transmitter voltage.

4. The method as claimed in claim 3, wherein the at least two differing transmitter voltages lie above and beneath the reference transmitter voltage through the use of transmitter scalings that result in flip angles that are less than or greater than the target flip angle.

5. The method as claimed in claim 1, wherein the measured signal intensities of individual pixels are interpolated linearly.

6. The method as claimed in claim 1, wherein the measured signal intensities of individual pixels are interpolated quadratically.

7. The method as claimed in claim 6, wherein the interpolation is carried out on the basis of a logarithmic scale.

8. The method as claimed in claim 1, wherein the measured intensities of individual pixels are interpolated by a weighted sum, wherein associated weighting factors are calculated from the transmit $B_1$ field map at a location of a pixel and differing transmitter scalings, and wherein a location-dependent noise increase factor is calculated from the associated weighting factors.

9. The method as claimed in claim 1, wherein a movement correction is carried out on at least one MR image.

10. The method as claimed in claim 1, wherein a parallel imaging is carried out.

11. The method as claimed in claim 1, wherein a plurality of interpolations having different target $B_1$ values is carried out from a plurality of MR images having differing transmitter scalings.

12. The method as claimed in claim 1, wherein a sign-sensitive interpolation, a phase-sensitive interpolation, or the sign-sensitive and the phase-sensitive interpolation are carried out.

13. The method as claimed in claim 1, wherein a receive-side $B_1$ correction is carried out by a receive $B_1$ field map ascertained through a numeric field simulation.

14. A system comprising:
a magnetic resonance device configured to:
determine a transmit $B_1$ field map for a region;
acquire a plurality of MR images of at least one part of the region, each MR image of the plurality of MR images being acquired using transmitter settings differing from transmitter settings used to acquire another MR image of the plurality of MR images;
interpolate signal intensities of pixels of the plurality of MR images using the transmit $B_1$ field map; and
generate a resultant MR image based on the interpolation of the signal intensities of the pixels,
wherein a receive-side $B_1$ correction is carried out by a spatial mirroring of the transmit $B_1$ field map on a symmetry plane of a measured object.

15. The system of claim 14, wherein the measured intensities of individual pixels are interpolated by a weighted sum,
wherein associated weighting factors are calculated from the transmit $B_1$ field map at a location of a pixel and differing transmitter scalings, and
wherein a location-dependent noise increase factor is calculated from the associated weighting factors.

* * * * *